(12) United States Patent
Abe et al.

(10) Patent No.: US 9,378,758 B2
(45) Date of Patent: *Jun. 28, 2016

(54) PLASMA ETCHING METHOD

(71) Applicant: Hitachi High-Technologies Corporation, Minato-ku, Tokyo (JP)

(72) Inventors: Takahiro Abe, Kudamatsu (JP); Naohiro Yamamoto, Kudamatsu (JP); Kentaro Yamada, Shunan (JP); Makoto Suyama, Shunan (JP); Daisuke Fujita, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/248,376

(22) Filed: Apr. 9, 2014

(65) Prior Publication Data

US 2014/0217061 A1  Aug. 7, 2014

Related U.S. Application Data

(63) Continuation of application No. 13/767,913, filed on Feb. 15, 2013, now Pat. No. 8,728,946.

(30) Foreign Application Priority Data

Dec. 17, 2012  (JP) .................................. 2012-274193

(51) Int. Cl.
G11B 5/31 (2006.01)
C23F 4/00 (2006.01)
(Continued)

(52) U.S. Cl.
CPC ............... *G11B 5/3163* (2013.01); *C23F 4/00* (2013.01); *G01R 33/098* (2013.01); *G11B 5/1278* (2013.01); *G11B 5/3909* (2013.01)

(58) Field of Classification Search
None
See application file for complete search history.

(56) References Cited

U.S. PATENT DOCUMENTS 8,728,946 B1 * 5/2014 Abe et al. ...................... 438/706
2002/0038681 A1 4/2002 Nakatani et al.
(Continued)

FOREIGN PATENT DOCUMENTS

JP  8-253881  10/1996
JP  2001-274144  10/2001
(Continued)

OTHER PUBLICATIONS

Office Action, mailed Dec. 22, 2015, which issued during the prosecution of Japanese Patent Application No. 2012-274193, which corresponds to the present application (a full English translation attached).

*Primary Examiner* — Duy Deo
(74) *Attorney, Agent, or Firm* — Baker Botts L.L.P.

(57) ABSTRACT

The present invention provides, in a plasma etching method for plasma-etching a magnetic film, a plasma etching method that allows a desired etching depth to be obtained regardless of the opening size of a mask. The present invention is, in a plasma etching method for plasma-etching a magnetic film by using a tantalum film as a mask, characterized by including: a first process to plasma-etch the magnetic film to a desired depth by using a mixed gas of an ammonia gas and a helium gas; and a second process, after the first process, to plasma-etch the magnetic film etched to the prescribed depth by using a mixed gas of an ammonia gas and a gas containing the oxygen element or a mixed gas of an ammonia gas and a gas containing a hydroxyl group.

3 Claims, 8 Drawing Sheets

(51) Int. Cl.
*G11B 5/127* (2006.01)
*G11B 5/39* (2006.01)
*G01R 33/09* (2006.01)

(56) References Cited

U.S. PATENT DOCUMENTS

| | | |
|---|---|---|
| 2002/0096493 A1 | 7/2002 | Hattori |
| 2004/0173568 A1 | 9/2004 | Hattori |
| 2006/0038246 A1 | 2/2006 | Maehara et al. |
| 2009/0314740 A1* | 12/2009 | Ikemoto et al. ............ 216/22 |
| 2011/0272380 A1 | 11/2011 | Jeong |

FOREIGN PATENT DOCUMENTS

| | | |
|---|---|---|
| JP | 2002-038285 A | 2/2002 |
| JP | 2010-045398 A | 2/2010 |

* cited by examiner

PLASMA ETCHING METHOD

CLAIM OF PRIORITY

The present application claims priority from Japanese Patent Application JP 2012-274193 filed on Dec. 17, 2012, the content of which is hereby incorporated by reference into this application.

This application is a Continuation application of prior application Ser. No. 13/767,913, filed Feb. 15, 2013, the contents of which are incorporated herein by reference in their entirety.

FIELD OF THE INVENTION

The present invention relates to a plasma etching method, in particular to a plasma etching method for plasma-etching a magnetic material.

BACKGROUND OF THE INVENTION

In recent years, a magnetic head shifts from a magnetic head utilizing a giant magneto-resistive (GMR) effect toward a magnetic head utilizing a tunnel magneto-resistance (TMR) effect and the densification of a surface recording density advances rapidly in order to correspond to the increase in capacity of a hard disk drive. In accordance with the densification of a surface recording density, a magnetic head used in a hard disk drive is required to be miniaturized and a microprocessing technology is required in the production of a magnetic head. In a manufacturing apparatus of a magnetic head therefore, the shift from the application of an ion milling device to the application of a plasma etching device advances.

A magnetic head has a magnetic pole layer to generate a recording magnetic field for recording information on a recording medium by a perpendicular magnetic recording method and a containing layer to contain it and the groove part of the containing layer is formed into a tapered shape. Further, the containing layer has heretofore comprised an alumina ($Al_2O_3$) film but in recent years magnetic materials such as iron (Fe), ferronickel (NiFe), ferrocobalt (CoFe), and cobalt nickel iron (CoNiFe) are adopted in accordance with the reduction of the number of processes at a containing layer forming process.

Each of the magnetic materials however has a very low volatility, hence can hardly obtain an etching speed and a perpendicular shape by plasma, and can hardly be subjected to microprocessing. Further, a reaction product generated during plasma etching tends to adhere to the internal wall of a plasma processing chamber and change plasma etching performance with the lapse of time.

As a plasma etching method enabling reactive ion etching to such a magnetic material, a dry etching method of using a carbon monoxide (CO) gas to which a nitrogen compound contained gas such as an ammonia ($NH_3$) or amine gas is added as a reaction gas is disclosed in Japanese Patent Application Laid-Open Publication No. H8-253881 for example.

Further, as a plasma etching method having a high selectivity of a material to be etched to a mask with a mixed gas of a nitrogen compound contained gas and a carbon monoxide gas, a method of carrying out etching by using the carbon monoxide gas to which the nitrogen compound contained gas is added as a reaction gas and a mask of tantalum or tantalum nitride is disclosed in Japanese Patent Application Laid-Open Publication No. 2001-274144.

SUMMARY OF THE INVENTION

Figure 10:
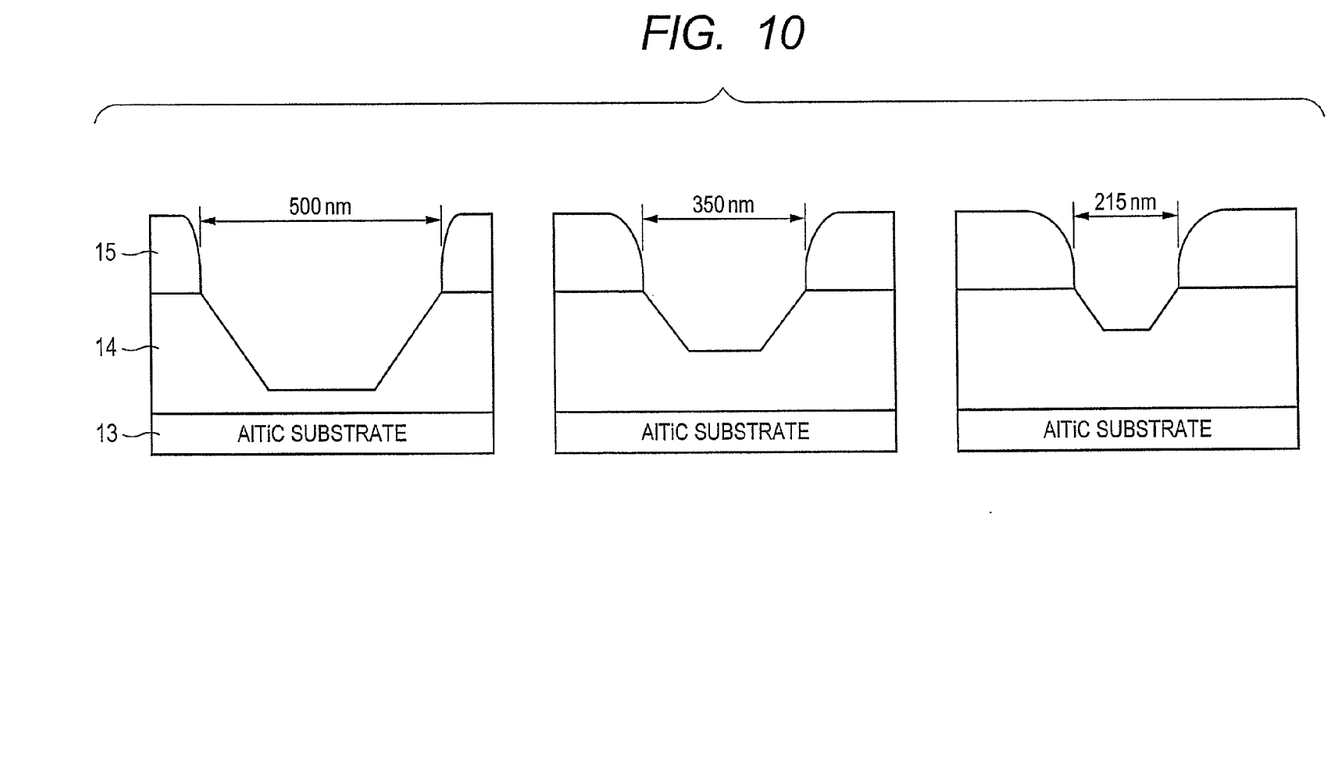
FIG. 10 comprises views showing the dependency of an etching depth in a magnetic film on an opening size of a mask.

When a magnetic film is plasma-etched by using a mixed gas of carbon monoxide (CO) and ammonia ($NH_3$) and a tantalum film as a mask, which is a conventional technology disclosed in Japanese Patent Application Laid-Open Publication No. 2001-274144, however, as shown in FIG. 10, as the opening size of a containing layer narrows, the shaved quantity in the depth direction reduces and, if the opening size of the containing layer comes to be narrower than 250 nm, etch stop is caused when the shaved quantity in the depth direction is around 150 nm and the phenomenon of not increasing the shaved quantity even when etching time is prolonged appears.

In view of the problems therefore, the present invention, in a plasma etching method for plasma-etching a magnetic film, provides the plasma etching method that allows a desired etching depth to be obtained regardless of the opening size of a mask.

The present invention is, in a plasma etching method for plasma-etching a magnetic film with a tantalum film as a mask, characterized by including: a first process to plasma-etch the magnetic film to a desired depth by using a mixed gas of an ammonia gas and a helium gas; and a second process, after the first process, to plasma-etch the magnetic film etched to the desired depth by using a mixed gas of an ammonia gas and a gas containing the oxygen element or a mixed gas of an ammonia gas and a gas containing a hydroxyl group.

The present invention makes it possible to obtain a desired etching depth regardless of the opening size of a mask in a plasma etching method for plasma-etching a magnetic film.

DETAILED DESCRIPTION OF THE PREFERRED EMBODIMENTS

An example of the present invention is hereunder explained in reference to drawings. Firstly, a plasma etching device used for carrying out the present invention is explained in reference to FIG. 1.

Figure 1:
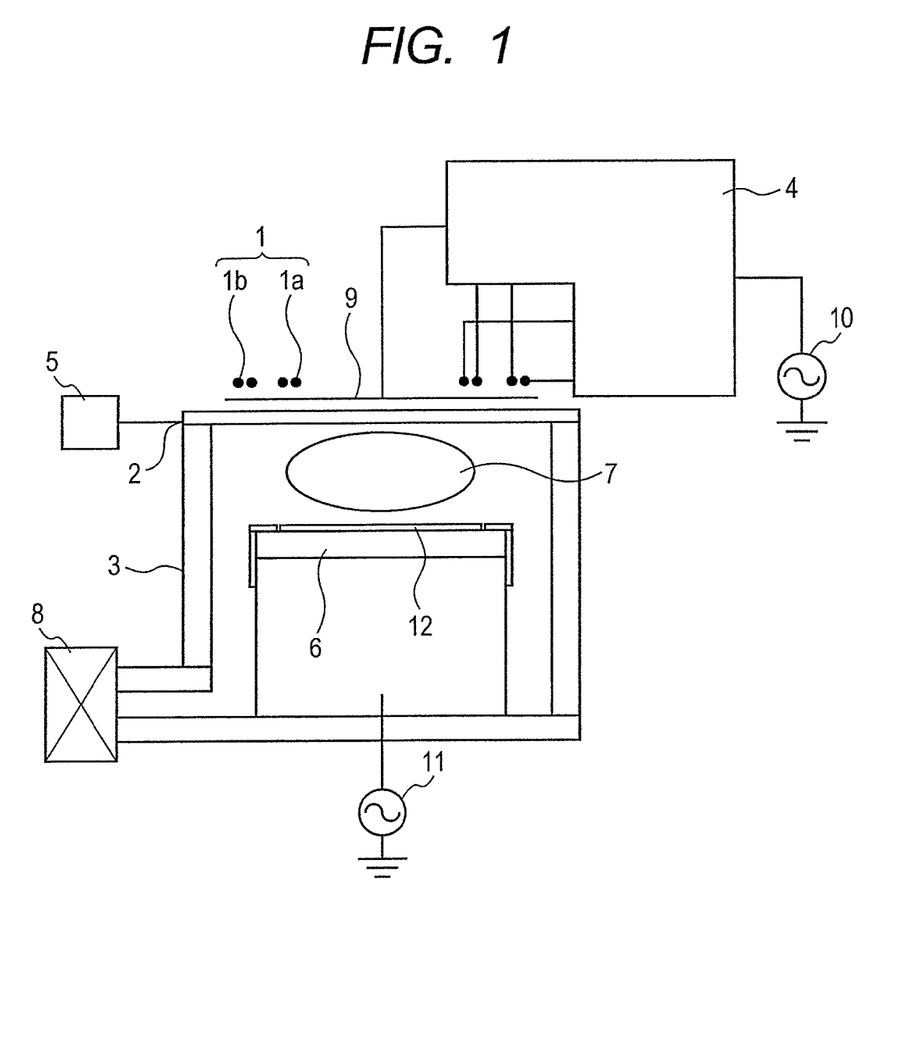
FIG. 1 is a schematic sectional view of a plasma etching device used in the present invention.

A plasma processing chamber includes a non-conductive material such as quartz ($SiO_2$) or ceramics ($Al_2O_3$) and has a discharge section 2 to form a plasma generation section and a processing section 3 where an electrode 6 over which a specimen 12 as an object to be processed is mounted is disposed. The processing section 3 is earthed to the ground and the electrode 6 is attached to the processing section 3 through an insulation material.

A coil-shaped inductive coupling antenna 1 to generate an induction magnetic field and a Faraday shield 9 that is a capacity coupling antenna are disposed above the discharge section 2 and radio-frequency power is supplied from a first radio-frequency power source 10 to the inductive coupling antenna 1 and the Faraday shield 9 through a matching box 4. Further, the inductive coupling antenna 1 comprises a coil-shaped first inductive coupling antenna 1a and a coil-shaped second inductive coupling antenna 1b disposed outside the first inductive coupling antenna 1a.

A process gas is supplied from a gas feed unit 5 into the interior of the plasma processing chamber and the interior of the plasma processing chamber is depressurized to a prescribed pressure by evacuation with an exhauster 8. Further, the process gas supplied into the interior of the plasma processing chamber from the gas feed unit 5 is turned into the state of plasma by an induction magnetic field generated with the inductive coupling antenna 1. Furthermore, a bias radio-frequency power is supplied from a second radio-frequency power source 11 to the electrode 6 in order to bring ions existing in plasma 7 over a specimen 12.

Meanwhile, the plasma etching device has a structure conforming to the etching of a hardly-etchable material and makes it possible to inhibit a reaction product from adhering to the discharge section 2 and remove the reaction product by applying radio-frequency voltage to the Faraday shield 9.

Figure 2:
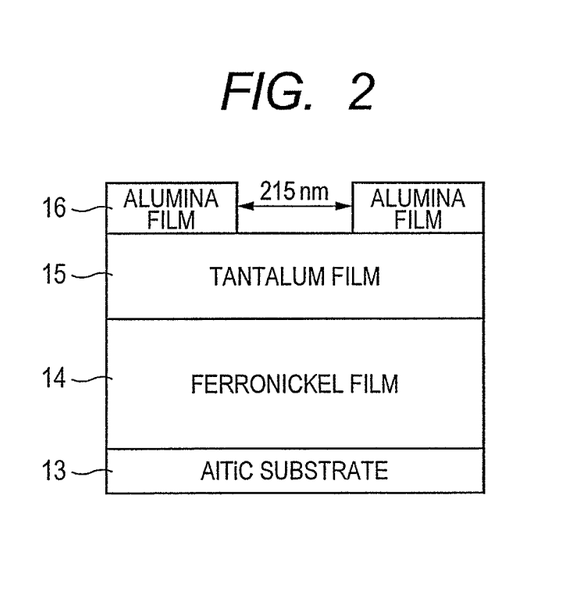
FIG. 2 shows a film structure of a specimen to be plasma-etched in the present invention.

The present invention of using a plasma etching device shown in FIG. 1 is explained hereunder. Firstly, the film structure of a specimen 12 plasma-etched according to the present invention is shown in FIG. 2.

A ferronickel film 14 of 500 nm in thickness, a tantalum film 15 of 170 nm in thickness, and an alumina film 16 of 50 nm in thickness are stacked in sequence from the bottom over an AlTiC substrate 13. Here, the alumina film 16 is patterned into a groove pattern beforehand by a lithography technology and is a mask having an opening width of 215 nm.

Firstly, a natural oxide film in the surface layer of the tantalum film 15 is removed by using the alumina film 16 as a mask and a mixed gas of a $Cl_2$ gas at 60 ml/min. and a $BCl_3$ gas at 20 ml/min. under the etching conditions of a processing pressure of 0.3 Pa, a source RF power of 800 W, and a bias RF power of 50 W as shown at Step 1 in Table 1. After the natural oxide film in the surface layer of the tantalum film 15 is removed consecutively, a mask of the tantalum film 15 is formed by using a mixed gas of a $Cl_2$ gas at 75 ml/min. and a $CF_4$ gas at 5 ml/min. under the conditions of a processing pressure of 0.3 Pa, a source RF power of 800 W, and a bias RF power of 35 W as shown at Step 2 in Table 1.

The conditions shown at Step 2 in Table 1 are conditions that allow a high selectivity to the alumina film 16 sufficient for forming a mask of the tantalum film 15 having a thickness of 170 nm with a mask of the alumina film 16 having a thickness of 50 nm to be obtained. Further, it is possible to control the angle of the etching shape of the tantalum film 15 to a desired angle (for example, in the range of 80 to 90 degrees) by adjusting a $CF_4$ gas flow rate. Here, in the present example, a nearly perpendicular mask of a tantalum film 15 can be formed by the $CF_4$ gas at 5 ml/min.

TABLE 1

| Step | $BCl_3$ ml/min | $Cl_2$ ml/min | $CF_4$ ml/min | Processing pressure Pa | Source RF power W | Bias RF power W |
|---|---|---|---|---|---|---|
| 1 | 60 | 20 | 0 | 0.3 | 800 | 50 |
| 2 | 0 | 75 | 5 | 0.3 | 800 | 35 |

Successively, after the mask of the tantalum film 15 is formed, the ferronickel film 14 is etched to a desired depth by using the alumina film 16 and the tantalum film 15 as masks and a mixed gas of an ammonia ($NH_3$) gas at 280 ml/min. and a helium (He) gas at 370 ml/min. under the etching conditions of a processing pressure of 3.0 Pa, a source RF power of 1800 W, and a bias RF power of 800 W as shown at Step 1 in Table 2. Here, a desired depth means a desired depth in the extent of not removing the whole of the ferronickel film 14 and is set at 300 nm in the present example.

Since the alumina film 16 is used as a mask when the tantalum film 15 is formed as a mask and the thickness is reduced, the alumina film 16 disappears during the etching of the ferronickel film 14 at Step 1 in Table 2. Consequently, the ferronickel film 14 is etched to a depth of 300 nm by using only the tantalum film 15 as a mask in the middle of the etching at Step 1 in Table 2.

TABLE 2

| Step | $NH_3$ ml/min | He ml/min | Co | Processing pressure Pa | Source RF power W | Bias RF power W |
|---|---|---|---|---|---|---|
| 1 | 280 | 370 | 0 | 3.0 | 1800 | 800 |
| 2 | 175 | 0 | 10 | 0.6 | 1800 | 500 |

Figure 3:
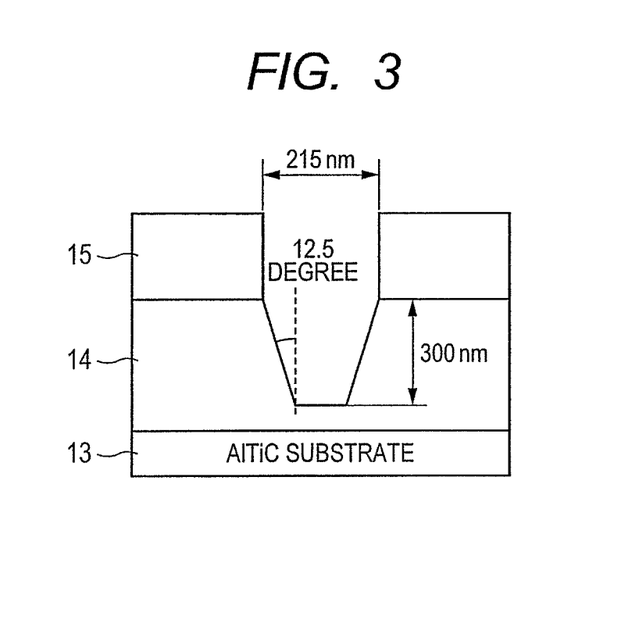
FIG. 3 is a sectional view showing a shape of a ferronickel film plasma-etched in the present invention.

Successively, after the ferronickel film 14 is etched to a depth of 300 nm, the ferronickel film 14 is etched and a tapered shape of 300 nm in depth having a desired angle as shown in FIG. 3 is obtained by using the tantalum film 15 as a mask and a mixed gas of an ammonia ($NH_3$) gas at 175 ml/min. and a carbon monoxide (CO) gas at 10 ml/min. under the etching conditions of a processing pressure of 0.6 Pa, a source RF power of 1800 W, and a bias RF power of 500 W as shown at Step 2 in Table 2.

Here, the processing pressure at Step 2 in Table 2 is lower than the processing pressure at Step 1 in Table 2. This: makes tantalum oxide (TaO) generated through reaction between a carbon monoxide (CO) gas and the tantalum film 15 as the mask likely to reach the bottom face of a groove; and contributes to the flattening of the groove bottom face. Consequently, it is desirable that the processing pressure at Step 2 in Table 2 is lower than the processing pressure at Step 1 in Table 2 and is not more than 1.0 Pa.

Meanwhile, it is concerned that the tantalum oxide (TaO) is generated excessively and the depth of the groove reduces if the flow rate of the carbon monoxide (CO) gas is excessive in comparison with the flow rate of the ammonia ($NH_3$) gas at Step 2 in Table 2 and hence it is desirable that the flow rate of the carbon monoxide (CO) gas is not more than 10% of the flow rate of the ammonia ($NH_3$) gas or not more than 15 ml/min. at Step 2 in Table 2.

Further, the bias RF power at Step 2 in Table 2 is lower than the bias RF power at Step 1 in Table 2. This: makes tantalum oxide (TaO) generated through reaction between a carbon monoxide (CO) gas and the tantalum film 15 as the mask likely to adhere to the bottom face of a groove; and contributes to the flattening of the groove bottom face. Consequently, it is desirable that the bias RF power at Step 2 in Table 2 is lower than the bias RF power at Step 1 in Table 2 or not more than two thirds of the bias RF power at Step 1 in Table 2.

A tapered shape of 300 nm in depth having a desired angle as shown in FIG. 3 is obtained by the present invention in this way. The reason why such an effect is obtained by the present invention is presumably as follows.

Figure 4:
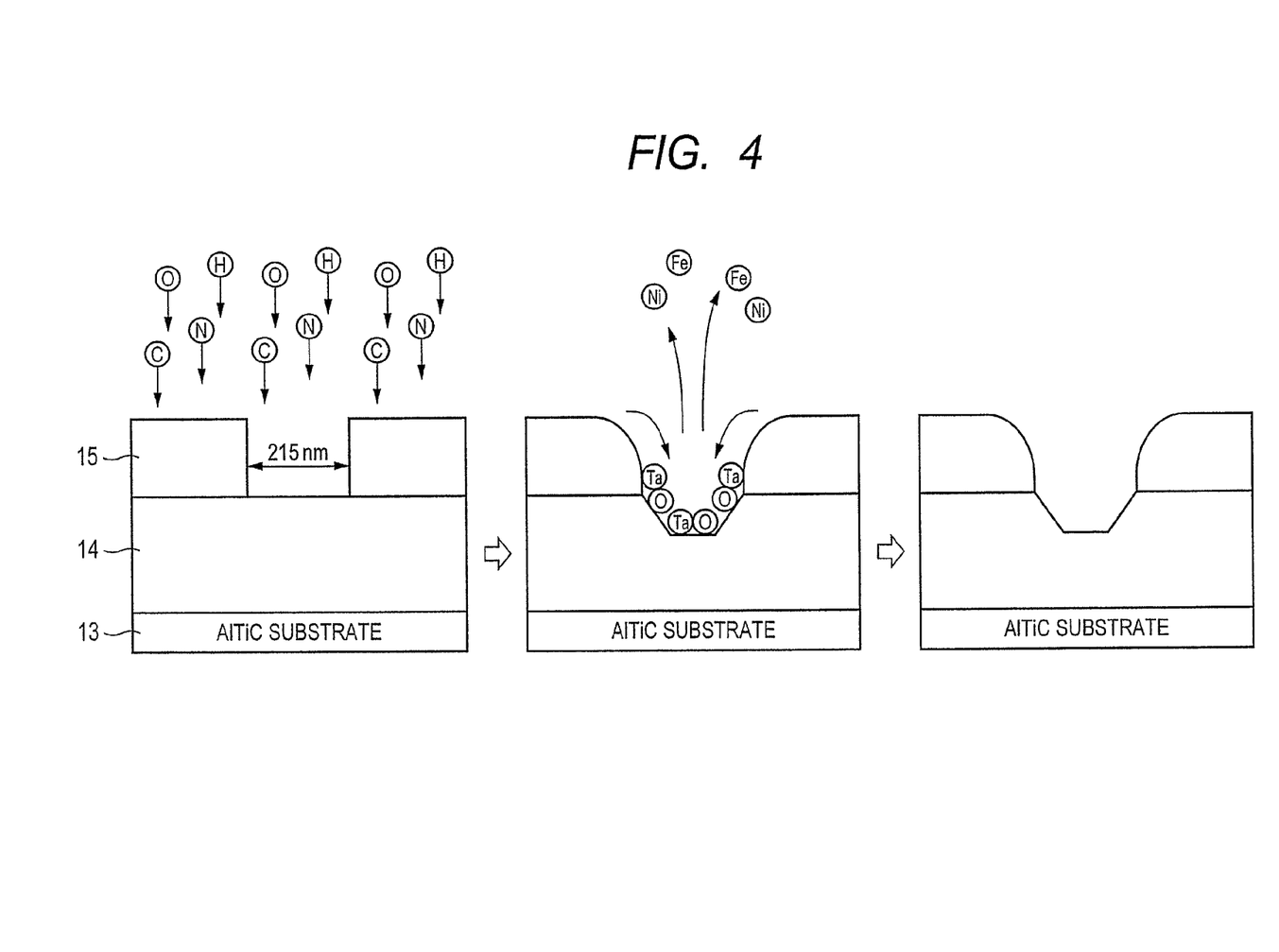
FIG. 4 comprises views showing a ferronickel film etched by a mixed gas of a methanol gas, a carbon monoxide gas, and an ammonia gas.

When a ferronickel film 14 is etched by using a mixed gas of a methanol ($CH_3OH$) gas, a carbon monoxide (CO) gas, and an ammonia ($NH_3$) gas and a tantalum film 15 of a groove pattern having an opening width of 215 nm as a mask for example, carbon atoms (C), oxygen atoms (O), nitrogen atoms (N), and hydrogen atoms (H) contained in the mixed gas are ionized and the ferronickel film 14 is etched mainly by physical action as shown in FIG. 4.

The oxygen atoms (O) react with the tantalum atoms (Ta) constituting the tantalum film 15, tantalum oxide (TaO) is generated and deposits over the whole bottom face of a groove, and, if the etching of the ferronickel film 14 advances to some extent however, the deposit of the tantalum oxide (TaO) exceeds the etching of the ferronickel film 14, thus the tantalum oxide (TaO) is hardly etched, and hence the etching of the ferronickel film 14 stops. As a result, etching does not advance in the depth direction even when etching time is increased and etching to a desired depth comes to be impossible.

Figure 5:
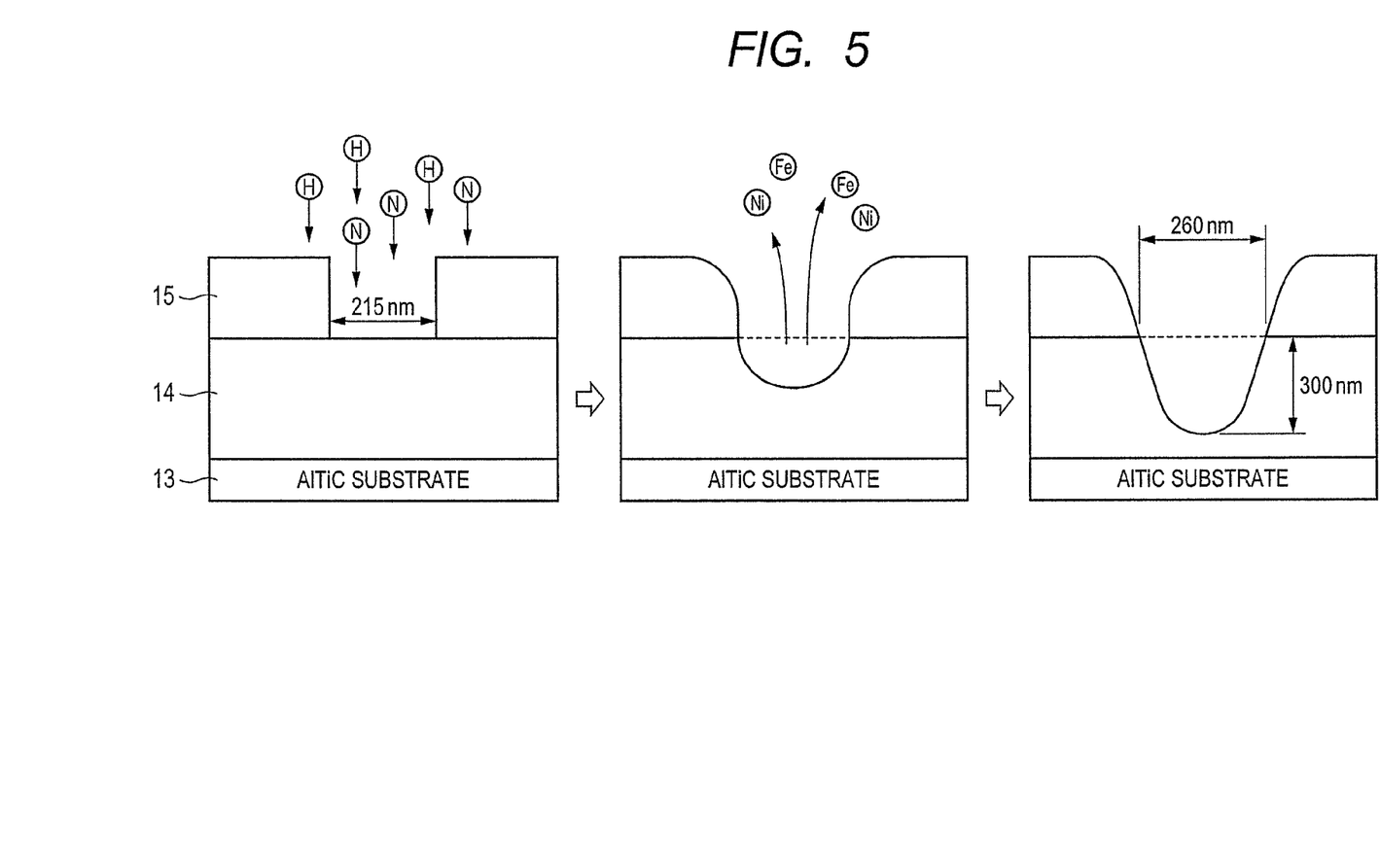
FIG. 5 comprises views showing a ferronickel film etched by an ammonia gas.

From the results, not to generate tantalum oxide is considered to be important in order to etch a ferronickel film 14 to a desired depth by using a tantalum film 15 as a mask. Then when a ferronickel film 14 is etched by using only an ammonia ($NH_3$) gas and a tantalum film 15 of a groove pattern having an opening width of 215 nm as a mask as shown in FIG. 5, tantalum (Ta) deposits over the etched face of the ferronickel film 14 but can be removed easily by the ammonia ($NH_3$) gas and hence it is possible to etch the ferronickel film 14 to a depth of 300 nm as shown in FIG. 5.

When a ferronickel film 14 is etched by using an ammonia ($NH_3$) gas however, the selectivity to a tantalum film 15 as a mask is low, hence the mask shoulder of the tantalum film 15 tends to retract, an opening size increases, and hence the taper angle of a groove shape increases.

Consequently, when a ferronickel film 14 is etched to a desired depth by using a tantalum film 15 as a mask, the ferronickel film 14 is etched by using a mixed gas of an ammonia ($NH_3$) gas and a helium (He) gas in order to improve the selectivity to the tantalum film 15 as a mask and not to generate tantalum oxide (TaO).

A helium (He) gas is an inert gas and hence is hardly reactive with a tantalum film 15. Further, a helium (He) gas is the lightest gas in inert gases, hence gives less damages to the tantalum film 15 as a mask, and inhibits the shoulder drop of the tantalum film 15 in particular.

Figure 6:
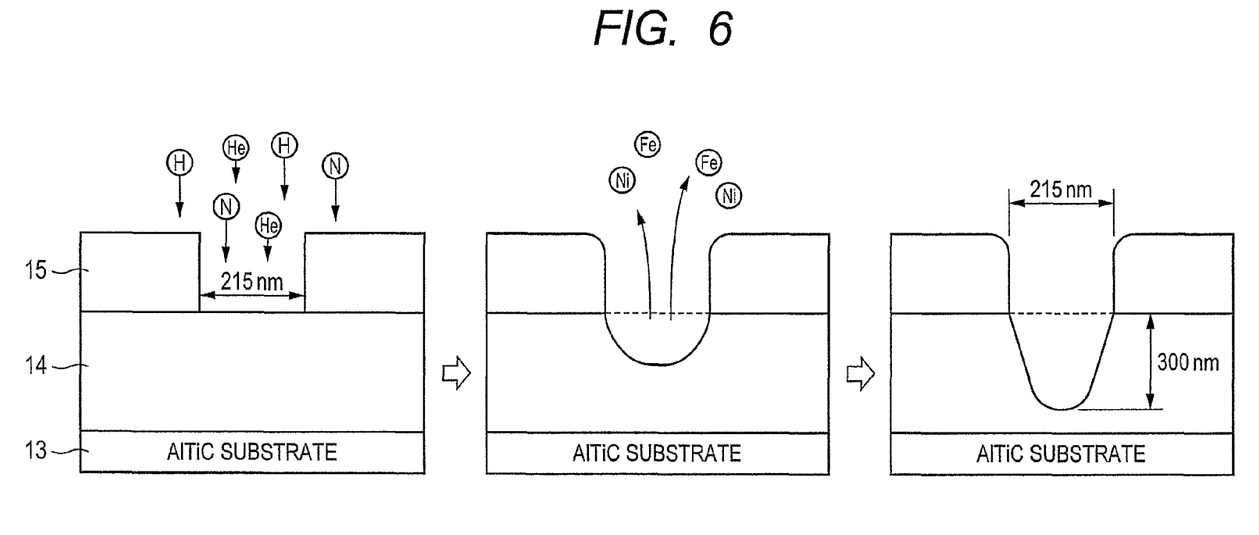
FIG. 6 comprises views showing a ferronickel film etched by a mixed gas of an ammonia gas and a helium gas.

Consequently, it is estimated that, when a ferronickel film 14 is etched by using a mixed gas of an ammonia ($NH_3$) gas and a helium (He) gas and a tantalum film 15 of a groove pattern having an opening width of 215 nm as a mask, it is possible to: inhibit the mask opening size of the tantalum film 15 from increasing; and etch the ferronickel film 14 to a depth of 300 nm as shown in FIG. 6.

The etching bottom face however has a round shape. Such a round shape may possibly cause bad influence including poor film forming and the deterioration of device performance. Consequently, it is necessary to change the round shape of the groove bottom face to a flat shape. For that reason, after a ferronickel film 14 is etched to a depth of 300 nm by using a mixed gas of an ammonia ($NH_3$) gas and a helium (He) gas, the ferronickel film 14 is further etched by using a mixed gas of an ammonia ($NH_3$) gas and a carbon monoxide (CO) gas.

Figure 7:
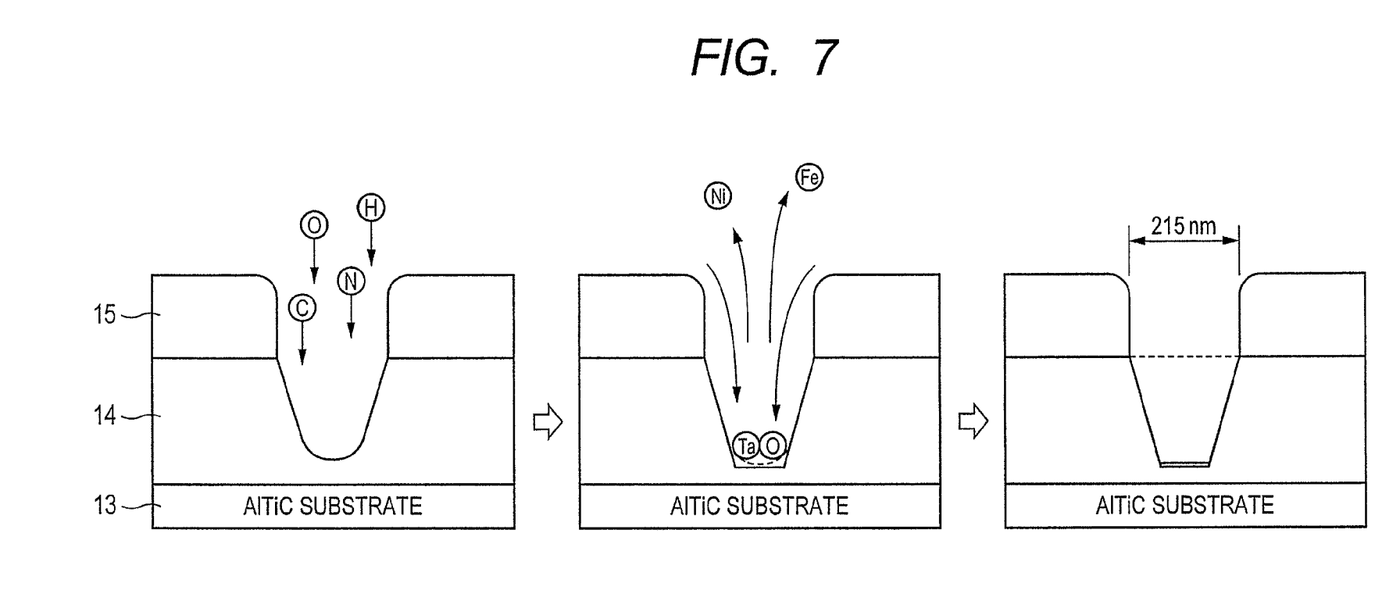
FIG. 7 comprises views showing a ferronickel film etched by a mixed gas of an ammonia gas and a carbon monoxide gas.

In the etching of a ferronickel film 14 by using a mixed gas of an ammonia ($NH_3$) gas and a carbon monoxide (CO) gas, it is estimated that tantalum oxide (TaO) is formed by the reaction of the carbon monoxide (CO) gas with a tantalum film 15 as a mask, the tantalum oxide (TaO) deposits over an etching bottom face, etching in the depth direction is inhibited, and hence the bottom face of a groove shape is flattened as shown in FIG. 7.

From the above results, it is estimated that a tapered shape of 300 nm in depth having a desired angle as shown in FIG. 3 is obtained by the present invention.

Figure 8:
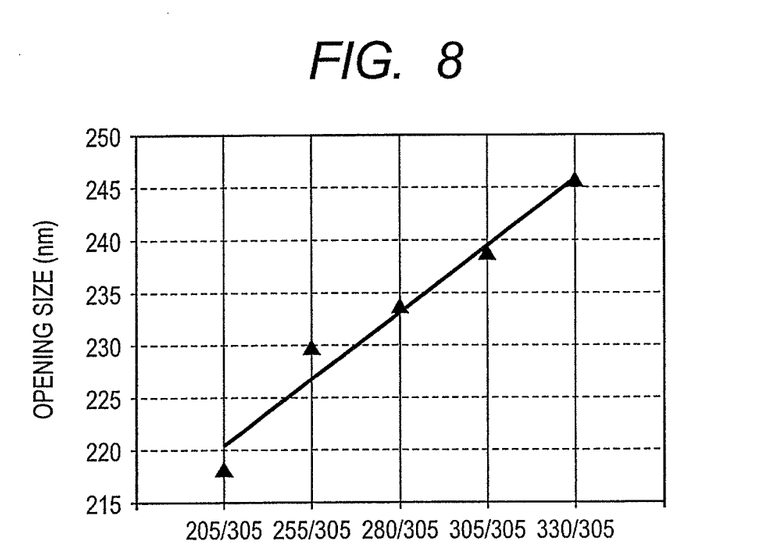
FIG. 8 is a graph showing the dependency of an opening size on a blend ratio of an ammonia gas and a helium gas.

A groove shape having an opening width of 215 nm is obtained by using an ammonia ($NH_3$) gas at 280 ml/min. and a helium (He) gas at 370 ml/min. at Step 1 in Table 2 in the present example and the opening size can be controlled by controlling the blend ratio of the ammonia ($NH_3$) gas to the helium (He) gas as shown in FIG. 8.

Further, although a mixed gas of an ammonia ($NH_3$) gas and a carbon monoxide (CO) gas is used in order to form the bottom face of a groove into a flat shape in the present example, it is also possible to use a gas containing the oxygen element such as a carbon dioxide ($CO_2$) gas, a nitrogen monoxide (NO) gas, or a nitrogen dioxide ($NO_2$) gas instead of the carbon monoxide (CO) gas.

Furthermore, although a mixed gas of an ammonia ($NH_3$) gas and a carbon monoxide (CO) gas is used in order to form the bottom face of a groove into a flat shape in the present example, it is also possible to use a mixed gas of an ammonia ($NH_3$) gas and a methanol ($CH_3OH$) gas.

For example, a tapered shape 300 nm in depth having a desired angle as shown in FIG. 3 is obtained by etching a ferronickel film 14 by using a tantalum film 15 as a mask and a mixed gas of an ammonia ($NH_3$) gas at 175 ml/min. and a methanol ($CH_3OH$) gas at 10 ml/min. under the etching conditions of a processing pressure of 0.6 Pa, a source RF power of 1800 W, and a bias RF power of 500 W as shown at Step 2 in Table 3 after the ferronickel film 14 is etched to a depth of 300 nm under the etching conditions shown at Step 1 in Table 3.

TABLE 3

| Step | $NH_3$ ml/min | He ml/min | $CH_3OH$ | Processing pressure Pa | Source RF power W | Bias RF power W |
|---|---|---|---|---|---|---|
| 1 | 280 | 370 | 0 | 3.0 | 1800 | 800 |
| 2 | 175 | 0 | 10 | 0.6 | 1800 | 500 |

Here, the processing pressure at Step 2 in Table 3 is lower than the processing pressure at Step 1 in Table 3. This: makes tantalum oxide (TaO) generated through reaction between a methanol ($CH_3OH$) gas and the tantalum film 15 as the mask likely to reach the bottom face of a groove; and contributes to the flattening of the groove bottom face. Consequently, it is desirable that the processing pressure at Step 2 in Table 3 is lower than the processing pressure at Step 1 in Table 3 and is not more than 1.0 Pa.

Meanwhile, it is concerned that the tantalum oxide (TaO) is generated excessively and the depth of the groove reduces if the flow rate of the methanol ($CH_3OH$) gas is excessive in comparison with the flow rate of the ammonia ($NH_3$) gas at Step 2 in Table 3 and hence it is desirable that the flow rate of the methanol ($CH_3OH$) gas is not more than 10% of the flow rate of the ammonia ($NH_3$) gas or not more than 15 ml/min. at Step 2 in Table 3.

Further, the bias RF power at Step 2 in Table 3 is lower than the bias RF power at Step 1 in Table 3. This: makes tantalum oxide (TaO) generated through reaction between a methanol ($CH_3OH$) gas and the tantalum film 15 as the mask likely to adhere to the bottom face of a groove; and contributes to the flattening of the groove bottom face. Consequently, it is desirable that the bias RF power at Step 2 in Table 3 is lower than the bias RF power at Step 1 in Table 3 or not more than two thirds of the bias RF power at Step 1 in Table 3.

Further, although a mixed gas of an ammonia ($NH_3$) gas and a methanol ($CH_3OH$) gas is used at Step 2 in Table 3, it is also possible to use a gas containing a hydroxyl group such as an ethanol ($C_2H_6O$) gas or a propanol ($C_3H_8O$) gas instead of the methanol ($CH_3OH$) gas.

Furthermore, although a ferronickel film 14 is etched to a depth of 300 nm by using a mixed gas of an ammonia ($NH_3$) gas and a helium (He) gas in the present example, a taper angle of a groove shape can be controlled in the range of ±1.2 degrees to a reference angle by increasing or decreasing the flow rate of the ammonia ($NH_3$) gas in the range of ±15% to a reference flow rate.

Figure 9:
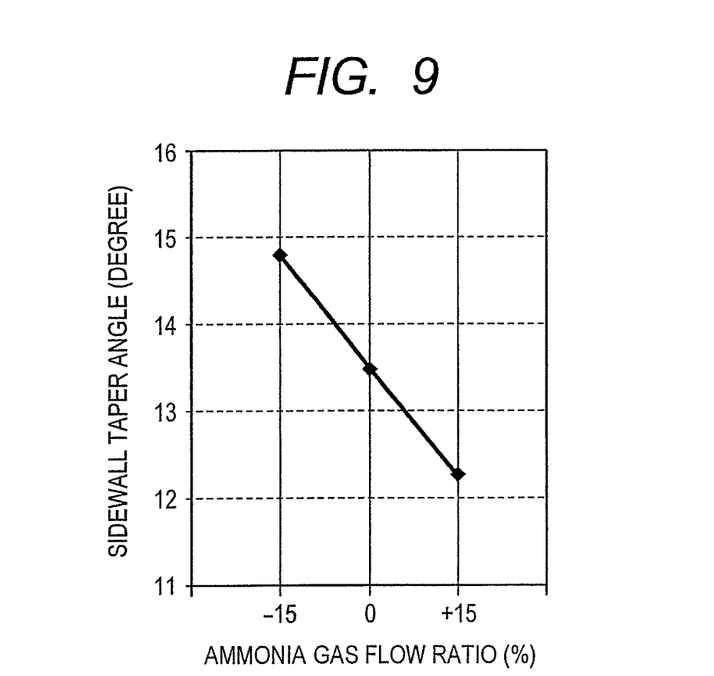
FIG. 9 is a graph showing the dependency of a taper angle of a groove shape on a ratio of a flow rate of an ammonia gas.

For example, in the case of a mixed gas of an ammonia ($NH_3$) gas at a flow rate of 245 ml/min. and a helium (He) gas at a flow rate of 305 ml/min., a tapered shape of 13.5 degrees is obtained as shown in FIG. 9. Successively, in the case of a mixed gas of an ammonia ($NH_3$) gas at a flow rate of 210 ml/min. and a helium (He) gas at a flow rate of 305 ml/min., a tapered shape of 14.7 degrees is obtained as shown in FIG. 9, and in contrast in the case of a mixed gas of an ammonia ($NH_3$) gas at a flow rate of 280 ml/min. and a helium (He) gas at a flow rate of 305 ml/min., a tapered shape of 12.3 degrees is obtained as shown in FIG. 9. The results can be considered as follows.

By increasing the flow rate of an ammonia ($NH_3$) gas to the flow rate of a helium (He) gas, the partial pressure of the ammonia ($NH_3$) gas in a processing pressure increases, ions in plasma are likely to scatter, and hence the ions are likely to collide with the sidewall of a groove pattern. As a result, a groove shape comes close to a perpendicular shape and the angle of a taper reduces.

In contrast, when the flow rate of an ammonia ($NH_3$) gas is lowered to the flow rate of a helium (He) gas, the partial pressure of the ammonia ($NH_3$) gas in a processing pressure decreases and the collision of the ions against the sidewall of a groove pattern decreases. As a result, a groove shape comes close to a tapered shape and the angle of a taper increases.

Although it is possible to control the taper angle of a groove shape in the range of ±1.2 degrees to a reference angle by increasing or decreasing the flow rate of an ammonia ($NH_3$) gas to a reference flow rate in the range of ±15% in this way, if the flow rate of an ammonia ($NH_3$) gas is increased or decreased in excess of the range of ±15%, balance with the residence time and the exhaust rate of the ammonia ($NH_3$) gas is disrupted, the lack of an etchant and the reattachment of a reaction product are caused, and such proportional relationship between a taper angle of the sidewall of a groove pattern and the ratio of the flow rate of an ammonia ($NH_3$) gas as shown in FIG. 9 cannot be obtained.

Although a tantalum film 15 is used as a mask in the present example, any material can be used as long as the material has a sufficiently high selectivity to a ferronickel film 14 when the material is oxidized and hence titanium (Ti), zirconium (Zr), yttrium (Y), or hafnium (Hf) may be used as a mask for example.

Further, although the present example is explained on the basis of the case of etching a ferronickel film 14, the same effects as the present example can be obtained even when a magnetic film containing at least one element of the iron (Fe) element, the nickel (Ni) element, and the cobalt (Co) element is etched. For example, a ferrocobalt (CoFe) film or a cobalt nickel iron (CoNiFe) film can also be used.

Furthermore, although the present example is explained on the basis of the case of using a plasma etching device of an inductive coupling type, the same effects as the present example can be obtained even when the present example is applied to a microwave plasma etching device of an ECR (Electron Cyclotron Resonance) type using a microwave and a magnetic field, a helicon wave plasma etching device, a capacity coupling type plasma etching device, or another plasma etching device.

As stated above, the present invention is characterized by plasma-etching a magnetic film to a desired depth by using a tantalum film as a mask and a mixed gas of an ammonia gas and a helium gas and successively plasma-etching the magnetic film etched to a desired depth by using a mixed gas of an ammonia gas and a gas containing the oxygen element or a mixed gas of an ammonia gas and a gas containing a hydroxyl group.

Further, the present invention makes it possible to: etch a magnetic film to a depth of 300 nm or more by using a tantalum film having an opening size of not more than 250 nm as a mask; and flatten the bottom face of a groove shape in a containing layer.

What is claimed is:

1. A plasma etching method for plasma-etching a magnetic film by using a tantalum film as a mask, the plasma etching method comprising:
    a first process to plasma-etch said magnetic film to a desired depth by using a mixed gas which consists of an ammonia gas and a helium gas; and
    a second process, after the first process, to plasma-etch the magnetic film to a prescribed depth by using a mixed gas which consists of an ammonia gas and a carbon monoxide gas.

2. The plasma etching method according to claim 1, wherein a flow rate of the helium gas is larger than that of the ammonia gas.

3. The plasma etching method according to claim 2, wherein a flow rate of the ammonia gas is larger than that of the carbon monoxide gas.

* * * * *